US009274891B2

(12) United States Patent
Lin et al.

(10) Patent No.: US 9,274,891 B2
(45) Date of Patent: Mar. 1, 2016

(54) DECODING METHOD, MEMORY STORAGE DEVICE, AND MEMORY CONTROLLING CIRCUIT UNIT

(71) Applicant: PHISON ELECTRONICS CORP., Miaoli (TW)

(72) Inventors: Wei Lin, Taipei (TW); Shao-Wei Yen, Kaohsiung (TW); Yu-Hsiang Lin, Yunlin County (TW); Kuo-Hsin Lai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 101 days.

(21) Appl. No.: 14/190,103

(22) Filed: Feb. 26, 2014

(65) Prior Publication Data

US 2015/0186212 A1    Jul. 2, 2015

(30) Foreign Application Priority Data

Dec. 31, 2013    (TW) .............................. 102149310 A

(51) Int. Cl.
*G06F 11/10* (2006.01)
*H03M 13/11* (2006.01)
*H03M 13/37* (2006.01)

(52) U.S. Cl.
CPC ........ *G06F 11/1076* (2013.01); *G06F 11/1072* (2013.01); *H03M 13/1108* (2013.01); *H03M 13/3707* (2013.01); *G06F 11/1068* (2013.01); *H03M 13/1102* (2013.01); *H03M 13/1111* (2013.01)

(58) Field of Classification Search
CPC ............ G06F 11/1068; G06F 11/1072; G06F 11/1044; H03M 13/1102; H03M 13/3707; H03M 13/1111; H03M 13/1108; H03M 13/152; H03M 13/45
USPC ........................................................ 714/763
See application file for complete search history.

(56) References Cited

U.S. PATENT DOCUMENTS

| 8,479,083 | B2 * | 7/2013 | Chae et al. ..................... 714/780 |
| 8,924,824 | B1 * | 12/2014 | Lu ........................ G06F 11/1048 365/185.2 |
| 2008/0109703 | A1 * | 5/2008 | Brandman ..................... 714/763 |
| 2009/0327591 | A1 | 12/2009 | Moshayedi |
| 2012/0079355 | A1 * | 3/2012 | Patapoutian et al. ......... 714/780 |
| 2012/0198314 | A1 | 8/2012 | Yang et al. |
| 2012/0240007 | A1 * | 9/2012 | Barndt et al. .................. 714/758 |
| 2013/0145238 | A1 * | 6/2013 | Alhussien et al. ............ 714/786 |
| 2013/0173985 | A1 * | 7/2013 | Chung et al. .................. 714/755 |
| 2013/0254628 | A1 * | 9/2013 | Kim et al. ..................... 714/773 |

OTHER PUBLICATIONS

"Office Action of Taiwan Counterpart Application", issued on Aug. 19, 2015, p. 1-p. 5, in which the listed references were cited.

* cited by examiner

*Primary Examiner* — James C Kerveros
(74) *Attorney, Agent, or Firm* — Jianq Chyun IP Office

(57) ABSTRACT

A decoding method, a memory storage device and a memory controlling circuit unit are provided. The decoding method includes: reading at least one memory cell according to a first read voltage to obtain at least one first verification bit; executing a hard bit mode decoding procedure according to the first verification bit, and determining whether a first valid codeword is generated by the hard bit mode decoding procedure; if the first valid codeword is not generated by the hard bit mode decoding procedure, obtaining storage information of the memory cell; deciding a voltage number according to the storage information; reading the memory cell according to second read voltages matching the voltage number to obtain second verification bits; and executing a soft bit mode decoding procedure according to the second verification bits. Accordingly, the speed of decoding is increased.

18 Claims, 12 Drawing Sheets

DECODING METHOD, MEMORY STORAGE DEVICE, AND MEMORY CONTROLLING CIRCUIT UNIT

CROSS-REFERENCE TO RELATED APPLICATION

This application claims the priority benefit of Taiwan application serial no. 102149310, filed on Dec. 31, 2013. The entirety of the above-mentioned patent application is hereby incorporated by reference herein and made a part of this specification.

BACKGROUND

1. Technology Field

The invention relates to a decoding method, and more particularly, to a decoding method, a memory storage device and a memory controlling circuit unit for a rewritable non-volatile memory module.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multimedia devices as cited above.

Generally, data written in the rewritable non-volatile memory module is encoded according to an error correcting code. The data read from the rewritable non-volatile memory module may be decoded through corresponding decoding procedure. Under some circumstances, a time required for the decoding may be longer if there is an error bit in the read data, and such error bit cannot be corrected. Therefore, how to increase a speed of decoding is one of the major subjects for person skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a decoding method, a memory storage device and a memory controlling circuit unit, capable of increasing the speed of decoding.

A decoding method is provided according to an exemplary embodiment of the invention, which is used in a rewritable non-volatile memory module. The rewritable non-volatile memory module may include a plurality of memory cells. The decoding method includes: reading at least one memory cell according to a first read voltage to obtain at least one first verification bit; executing a hard bit mode decoding procedure according to the first verification bit, and determining whether a first valid codeword is generated by the hard bit mode decoding procedure; if the first valid codeword is not generated by the hard bit mode decoding procedure, obtaining storage information of the memory cell; deciding a voltage number according to the storage information; reading the memory cell according to second read voltages matching the voltage number to obtain second verification bits; and executing a first soft bit mode decoding procedure according to the second verification bits.

A memory storage device is provided according to an exemplary embodiment of the invention, which includes a connection interface unit, a rewritable non-volatile memory module and a memory controlling circuit unit. The connection interface unit is configured to couple to a host system. The rewritable non-volatile memory module includes a plurality of memory cells. The memory controlling circuit unit is coupled to the connection interface unit and the rewritable non-volatile memory module, and configured to read at least one memory cell according to a first read voltage to obtain at least one first verification bit, execute a hard bit mode decoding procedure according to the first verification bit, and determining whether a first valid codeword is generated by the hard bit mode decoding procedure. If the first valid codeword is not generated by the hard bit mode decoding procedure, the memory controlling circuit unit is configured to obtain storage information of the memory cell, decide a voltage number according to the storage information, read the memory cell according to a plurality of second read voltages matching the voltage number to obtain a plurality of second verification bits, and execute a first soft bit mode decoding procedure according to the second verification bits.

A memory controlling circuit unit is provided according to an exemplary embodiment of the invention, and configured to control the rewritable non-volatile memory module described above. The memory controlling circuit unit includes a host interface, a memory interface, a memory management circuit and an error checking and correcting circuit. The host interface is configured to couple to a host system. The memory interface is configured to couple to the rewritable non-volatile memory module. The memory management circuit is coupled to the host interface and the memory interface, and configured to read at least one memory cell according to a first read voltage to obtain at least one first verification bit. The error checking and correcting circuit is configured to execute a hard bit mode decoding procedure according to the first verification bit, and determine whether a first valid codeword is generated by the hard bit mode decoding procedure. If the first valid codeword is not generated by the hard bit mode decoding procedure, the memory management circuit is configured to obtain storage information of the memory cell, decide a voltage number according to the storage information, read the memory cell according to a plurality of second read voltages matching the voltage number to obtain a plurality of second verification bits. The error checking and correcting circuit is configured to execute a first soft bit mode decoding procedure according to the second verification bits.

Based on above, in the decoding method, the memory storage device, the memory controlling circuit unit proposed according to the exemplary embodiments of the invention, a number of read voltages may be gradually increased, so as to increase the speed of decoding.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings

DESCRIPTION OF THE EMBODIMENTS

Figure 1:
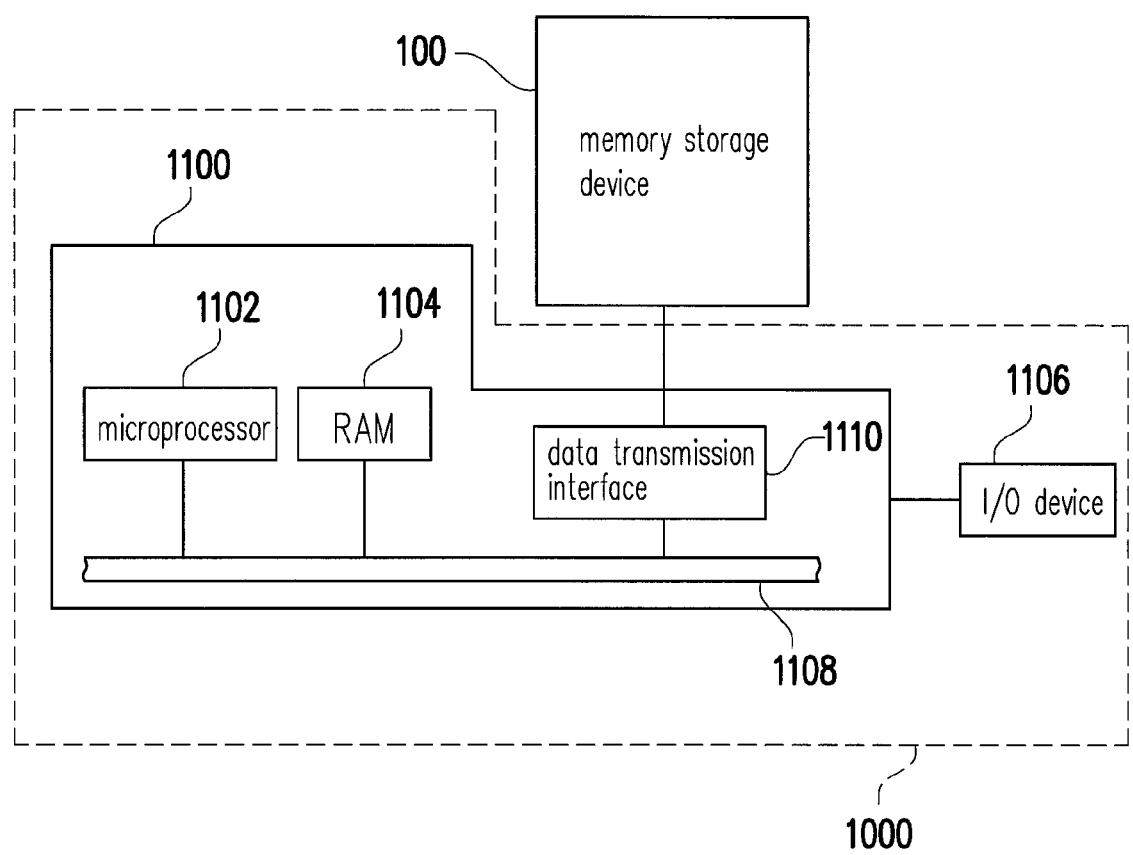
FIG. 1 illustrates a host system and a memory storage device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data to or read data from the memory storage device.

Figure 2:
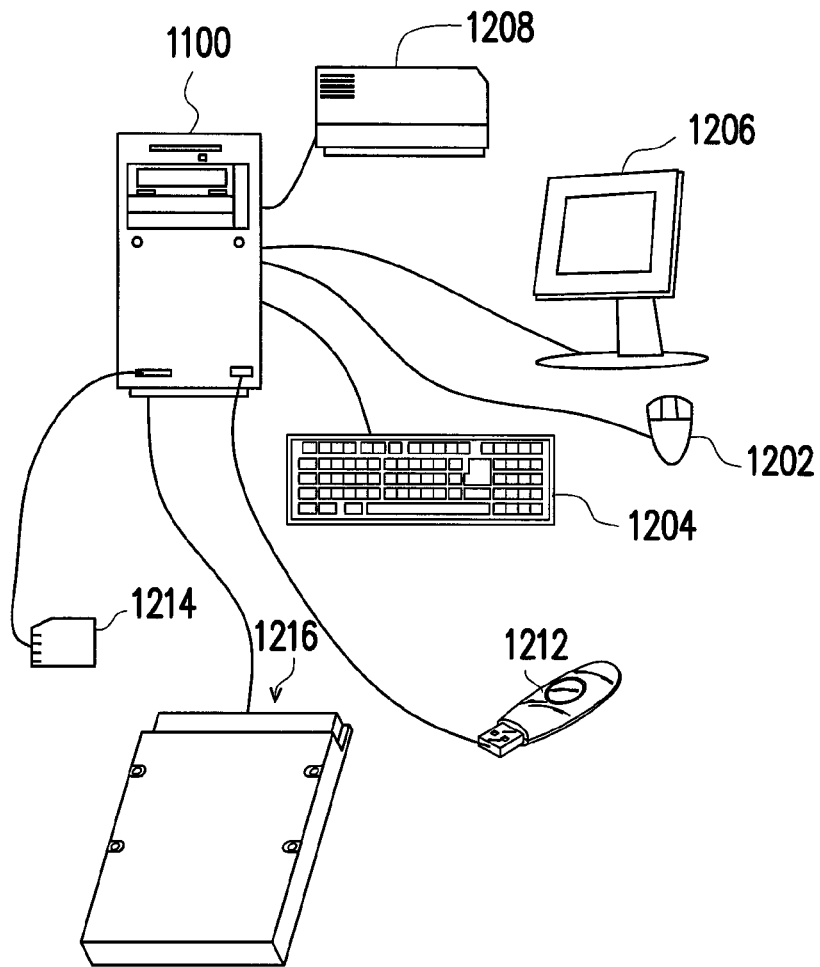
FIG. 2 is a schematic diagram illustrating a computer, an input/output device and a memory storage device according to an exemplary embodiment.

FIG. 1 illustrates a host system and a memory storage device according to an exemplary embodiment. FIG. 2 is a schematic diagram illustrating a computer, an input/output device and a memory storage device according to an exemplary embodiment.

Referring to FIG. 1, a host system 1000 includes a computer 1100 and an input/output (I/O) device 1106. The computer 1100 includes a microprocessor 1102, a random access memory (RAM) 1104, a system bus 1108, and data transmission interface 1110. For example, the I/O device 1106 includes a mouse 1202, a keyboard 1204, a display 1206 and a printer 1208 as shown in FIG. 2. It should be understood that the devices illustrated in FIG. 2 are not intended to limit the I/O device 1106, and the I/O device 1106 may further include other devices.

In the present embodiment of the invention, the memory storage device 100 is coupled to other devices of the host system 1000 through the data transmission interface 1110. By using the microprocessor 1102, the random access memory (RAM) 1104 and the Input/Output (I/O) device 1106, data may be written into the memory storage device 100 or may be read from the memory storage device 100. For example, the memory storage device 100 may be a rewritable non-volatile memory storage device such as a flash drive 1212, a memory card 1214, or a solid state drive (SSD) 1216 as shown in FIG. 2.

Figure 3:
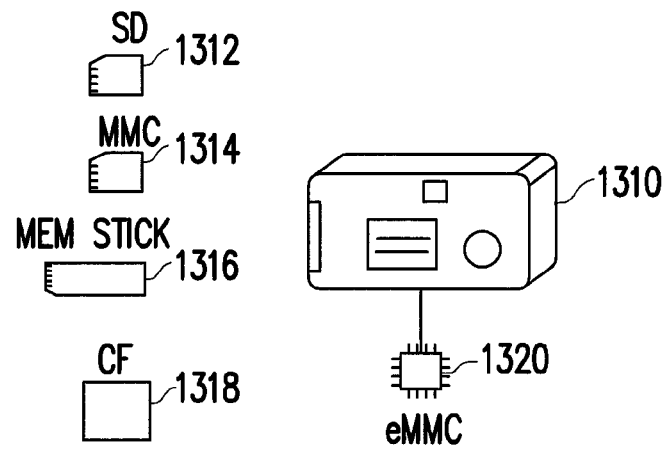
FIG. 3 is a schematic diagram of a host system and a memory storage device according to an exemplary embodiment.

FIG. 3 is a schematic diagram of a host system and a memory storage device according to an exemplary embodiment.

Generally, the host system 1000 may substantially be any system capable of storing data with the memory storage device 100. Although the host system 1000 is described as a computer system in the present exemplary embodiment, in another exemplary embodiment of the invention, the host system 1000 may be a digital camera, a video camera, a telecommunication device, an audio player, or a video player. For example, if the host system is a digital camera (video camera) 1310, the rewritable non-volatile memory storage device may be a SD card 1312, a MMC card 1314, a memory stick 1316, a CF card 1318 or an embedded storage device 1320 (as shown in FIG. 3). The embedded storage device 1320 includes an embedded MMC (eMMC). It should be mentioned that the eMMC is directly coupled to a substrate of the host system.

Figure 4:
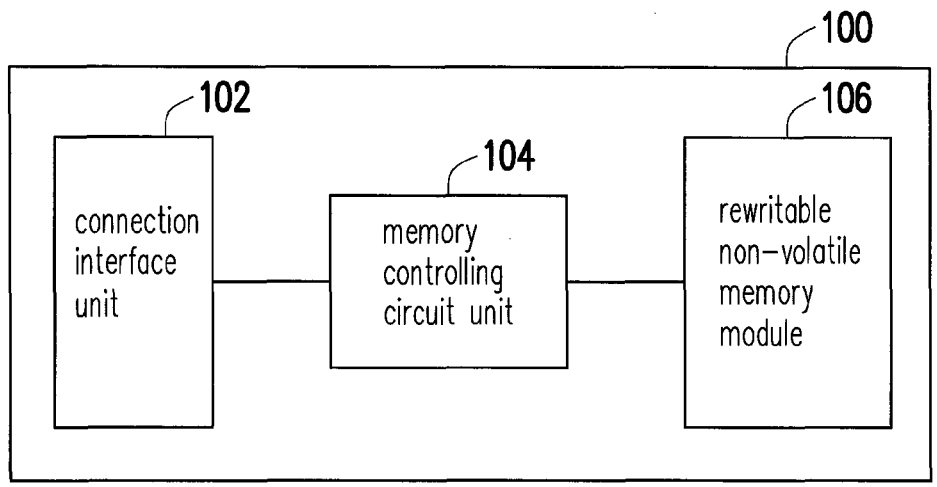
FIG. 4 is a schematic block diagram of the memory storage device in FIG. 1.

FIG. 4 is a schematic block diagram of the memory storage device in FIG. 1.

Referring to FIG. 4, the memory storage device 100 includes a connection interface unit 102, a memory controlling circuit unit 104 and a rewritable non-volatile memory storage module 106.

In the present exemplary embodiment, the connection interface unit 102 is compatible with a serial advanced technology attachment (SATA) standard. However, the invention is not limited thereto, and the connection interface unit 102 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 102 and the memory controlling circuit unit 104 may be packaged into one chip, or the connection interface unit 102 is distributed outside of a chip containing the memory controlling circuit unit 104.

The memory controlling circuit unit 104 is configured to execute a plurality of logic gates or control commands which are implemented in a hardware form or in a firmware form, so as to perform operations of writing, reading or erasing data in the rewritable non-volatile memory storage module 106 according to the commands of the host system 1000.

The rewritable non-volatile memory storage module 106 is coupled to the memory controlling circuit unit 104 and configured to store data written from the host system 1000. The rewritable non-volatile memory module 106 may be a Single Level Cell (SLC) NAND flash memory module, a Multi Level Cell (MLC) NAND flash memory module (i.e., a flash memory module capable of storing two bits of data in one memory cell), a Triple Level Cell (TLC) NAND flash memory module (i.e., a flash memory module capable of storing three bits of data in one memory cell), other flash memory modules or any memory module having the same features.

Figure 5:
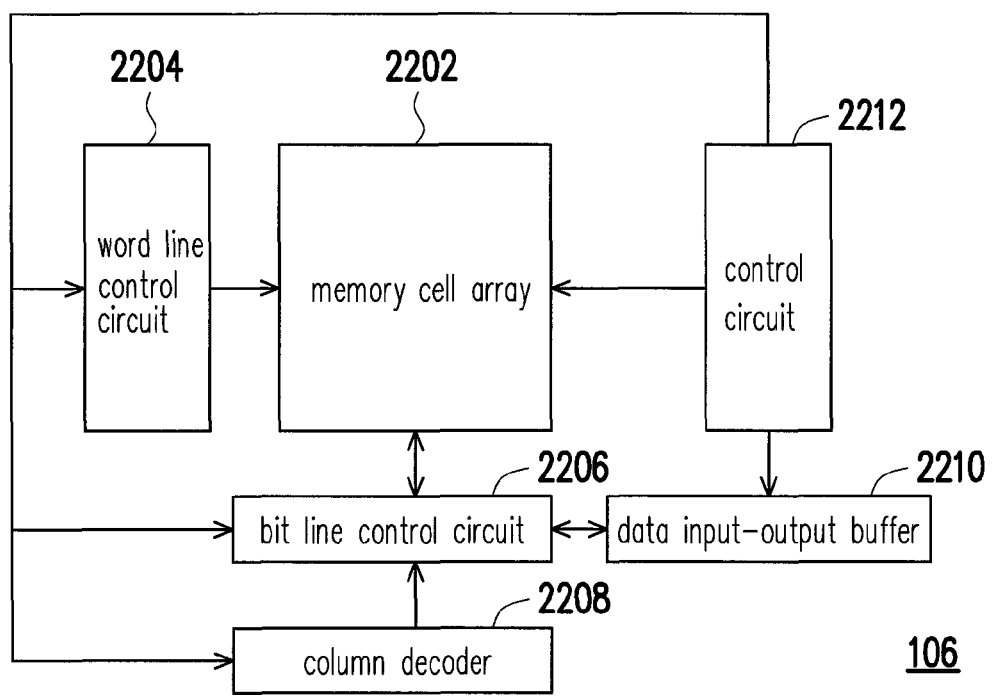
FIG. 5 is a schematic block diagram illustrating a rewritable non-volatile memory module according to an exemplary embodiment.
Figure 6:
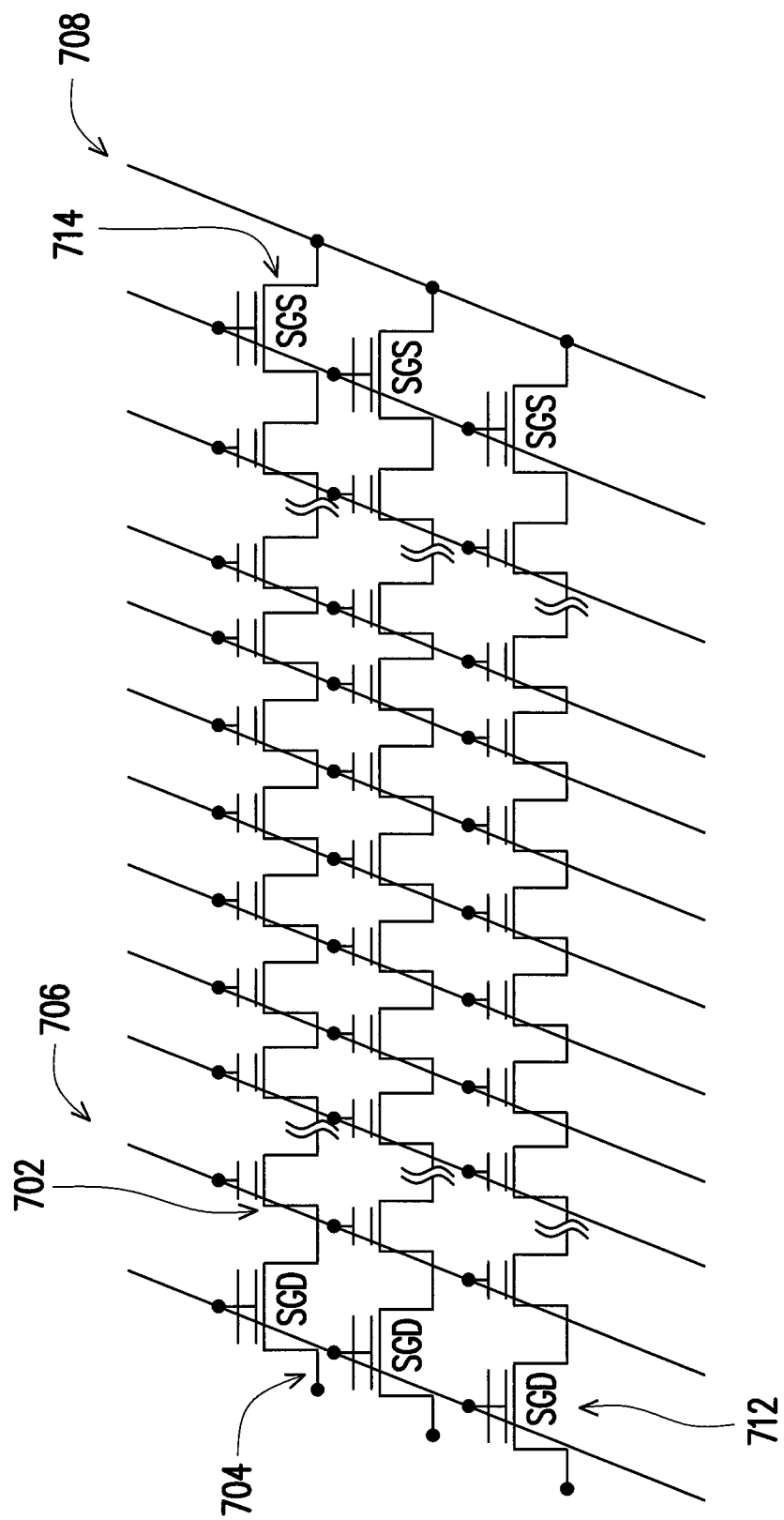
FIG. 6 is a schematic diagram illustrating a memory cell array according to an exemplary embodiment.

FIG. 5 is a schematic block diagram illustrating a rewritable non-volatile memory module according to an exemplary embodiment. FIG. 6 is a schematic diagram illustrating a memory cell array according to an exemplary embodiment.

Referring to FIG. 5, the rewritable non-volatile memory module 106 includes a memory cell array 2202, a word line control circuit 2204, a bit line control circuit 2206, a column decoder 2208, a data input-output buffer 2210 and a control circuit 2212.

In the present exemplary embodiment, the memory cell array 2202 may include a plurality of memory cells 702 used to store data, a plurality of select gate drain (SGD) transistors 712, a plurality of select gate source (SGS) transistors 714, as well as a plurality of bit lines 704, a plurality of word lines 706, a common source line 708 connected to the memory cells (as shown in FIG. 6). The memory cell 702 is disposed at intersections of the bit lines 704 and the word lines 706 in a matrix manner (or in a 3D stacking manner). In case a writing command or a reading command is received from the memory controlling circuit unit 104, the control circuit 2212 controls the word line control circuit 2204, the bit line control circuit 2206, the column decoder 2208, the data input-output buffer 2210 to write the data in the memory cell array 2202 or read the data from the memory cell array 2202. Therein, the word line control circuit 2204 is configured to control voltages applied to the word lines 706; the bit line control circuit 2206 is configured to control voltages applied to the bit lines 704; the column decoder 2208 is configured to select the corresponding bit line according to a row address in a command; and the data input-output buffer 2210 is configured to temporarily store the data.

The memory cell in the rewritable non-volatile memory module 106 may store multiple bits by changing a threshold voltage of one memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This procedure of changing the threshold voltage is also referred to as "writing data into the memory cell" or "programming the memory cell". Each of the memory cells in the memory cell array 2022 has a plurality of storage statuses depended on changes in the threshold voltage. Moreover, which of the storage statuses is the memory cell belong to may be determined through read voltages, so as to obtain the bits stored in the memory cell.

Figure 7:
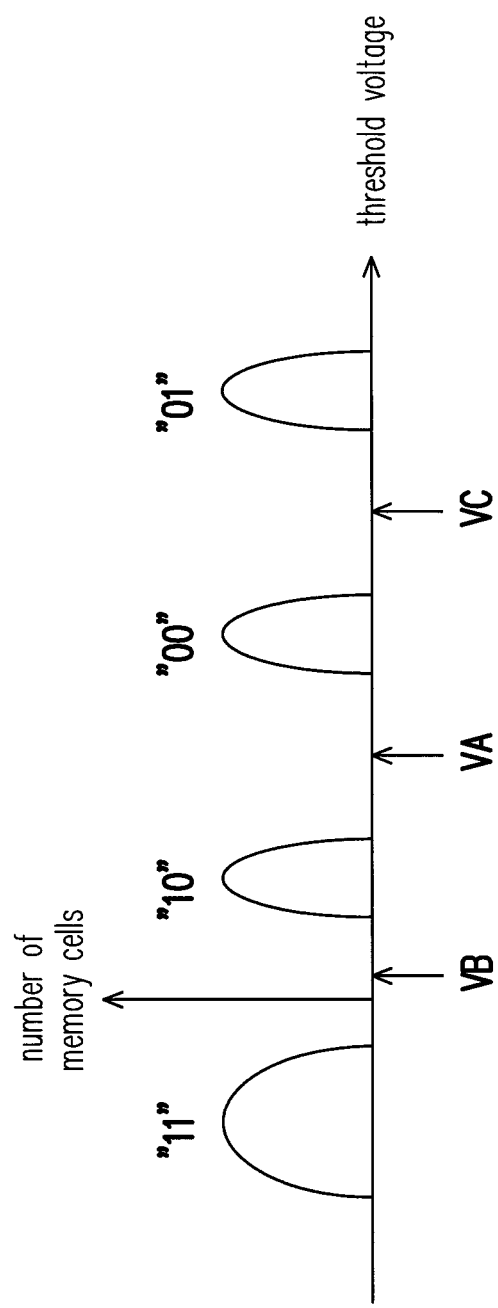
FIG. 7 is a histogram of a gate voltage corresponding to write data stored in the memory cell array according to an exemplary embodiment.

FIG. 7 is a histogram of a gate voltage corresponding to write data stored in the memory cell array according to an exemplary embodiment.

Referring to FIG. 7 that takes the MLC NAND flash memory for example, in which each of the memory cells has four storage statuses depended on different threshold voltages, and the statuses represent bits "11", "10", "00" and "01", respectively. In other words, each of the statuses includes a least significant bit (LSB) and a most significant bit (MSB). In the present exemplary embodiment, a first bit counted from the left in the statuses (i.e., "11", "10", "00" and "01") is the LSB, and a second bit counted from the left is the MSB. Accordingly, in this exemplary embodiment, each of the memory cells may store two bits. It should be understood that, the storage statuses corresponding to the threshold voltage as illustrated in the FIG. 7 are merely an example. In another exemplary embodiment of the invention, the storage statuses corresponding to the threshold voltage may also have an arrangement of "11", "10", "01" and "00" that is arranged according to the threshold voltage from small to large, or other arrangements. In addition, in another exemplary embodiment, it can also be defined that the first bit counted from the left is the MSB, and the second bit counted from the left is the LSB.

Figure 8:
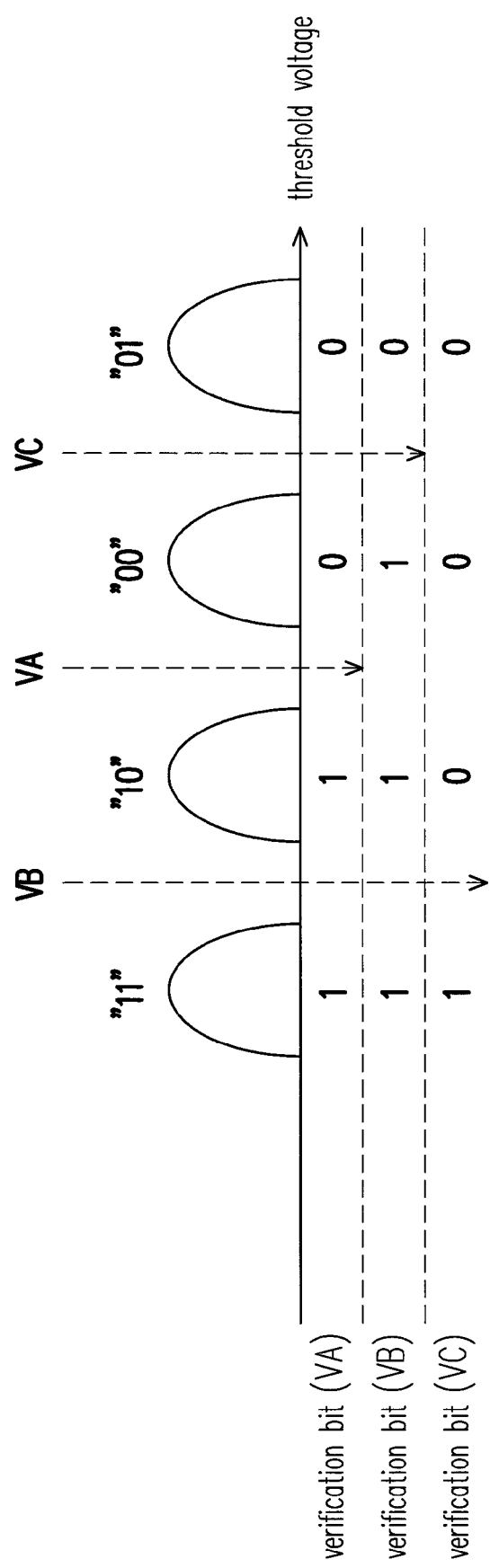
FIG. 8 illustrates a schematic diagram of reading data from a memory cell according to an exemplary embodiment.

FIG. 8 illustrates a schematic diagram of reading data from a memory cell according to an exemplary embodiment, which uses a MLC NAND flash memory for example.

Referring to FIG. 8, in a reading operation for the memory cells of the memory cell array 2202, the read voltage is applied to the control gate, and data stored in the memory cells are identified according whether the channel of the memory cell is turned on. A verification bit (VA) is configured to indicate whether the channel of the memory cell is turned on when a read voltage VA is applied; a verification bit (VC) is configured to indicate whether the channel of the memory cell is turned on when a read voltage VC is applied; and a verification bit (VB) is configured to indicate whether the channel of the memory cell is turned on when a read voltage VB is applied. It is assumed that the corresponding channel of the memory cell being turned on is indicated by the verification bit being "1", and the corresponding channel of the memory cell not being turned on is indicated by the verification bit being "0". As shown in FIG. 8, which of the storage statuses the memory cell is in may be determined according to the verification bits (VA) to (VC), thereby obtaining the bits being stored.

Figure 9:
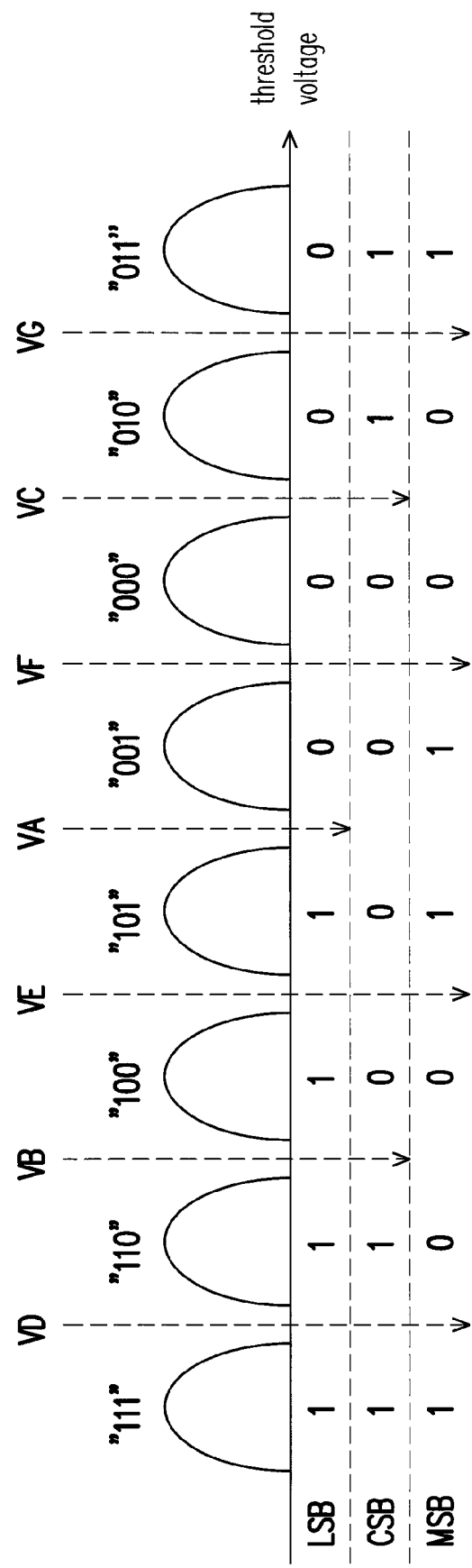
FIG. 9 illustrates a schematic diagram of reading data from a memory cell array according to another exemplary embodiment.

FIG. 9 illustrates a schematic diagram of reading data from a memory cell array according to another exemplary embodiment.

Referring to FIG. 9 which takes a TLC NAND flash memory for example, each of the storage statues includes a first bit counted from the left being the least significant bit (LSB), a second bit counted from the left being a center significant bit (CSB) and a third bit counted from the left being the most significant bit (MSB). In this embodiment, the memory cell includes eight storage statuses depended on different threshold voltages (i.e., "111", "110", "100", "101", "001", "000", "010" and "011"). The bits stored in the memory cell may be identified by applying the read voltages VA to VC to the control gate. Therein, it should be noted that, an arranging sequence of the eight storage statuses may be decided based on designs of manufacturers without being limited by the arranging sequence of this embodiment.

Figure 10:
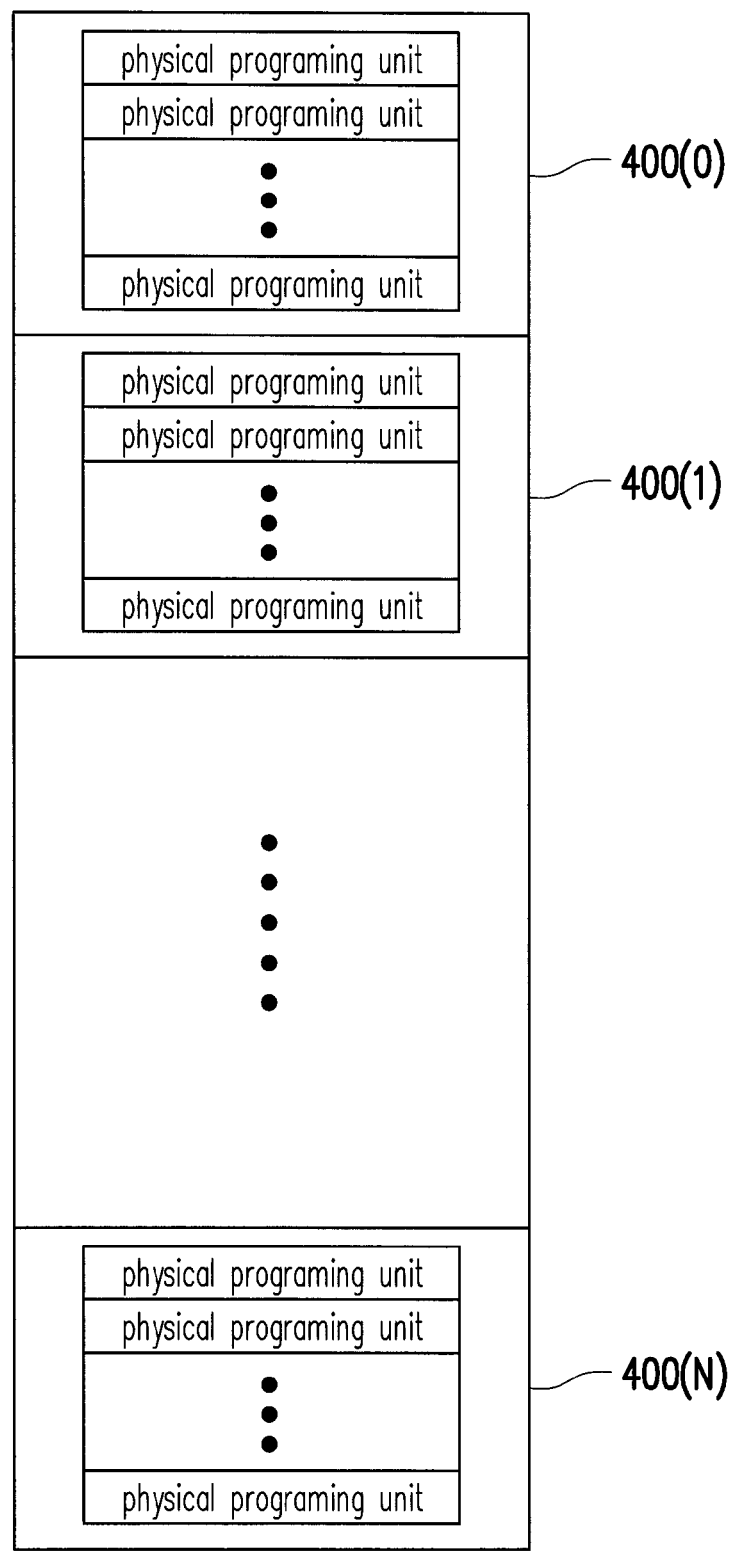
FIG. 10 is a schematic diagram illustrating a management of the rewritable non-volatile memory module according to an exemplary embodiment.

FIG. 10 is a schematic diagram illustrating a management of the rewritable non-volatile memory module according to an exemplary embodiment.

Referring to FIG. 10, the memory cells 702 of the rewritable non-volatile memory module 106 constitute a plurality of physical programming units, and the physical programming units constitutes a plurality of physical erasing units 400(0) to 400(N). More specifically, the memory cells on the same word line are grouped into one or more physical programming units. In case each of the memory cells can store two or more bits, the physical programming units on the same word line can be classified into a lower physical programming unit and an upper physical programming unit. For instance, the LSB of each memory cell is the lower physical programming unit, and the MSB of each memory cell is the upper physical programming unit. Generally, in the MLC NAND flash memory, a writing speed of the lower physical programming unit is faster than a writing speed of the upper physical programming unit, or a reliability of the lower physical programming unit is higher than a reliability of the upper physical programming unit. In the present exemplary embodiment, the physical programming unit is a minimum unit for programming. That is, the physical programming unit is the minimum unit for writing data. For example, the physical programming unit is a physical page or a physical sector. In case the physical programming unit is the physical page, each physical programming unit usually includes a data bit area and a redundancy bit area. The data bit area has multiple physical sectors configured to store user data, and the redundant bit area is configured to store system data (e.g., an error correcting code). In the present exemplary embodiment, each of the data bit areas contains 32 physical sectors, and a size of each physical sector is 512-byte (B). However, in other exemplary embodiments, the data bit area may also include 8, 16, or more or less of the physical sectors, and amount and sizes of the physical sectors are not limited in the invention. On the other hand, the physical erase unit is the minimal unit for erasing. Namely, each physical erasing unit contains the least number of memory cells to be erased together. For instance, the physical erasing unit is a physical block.

Figure 11:
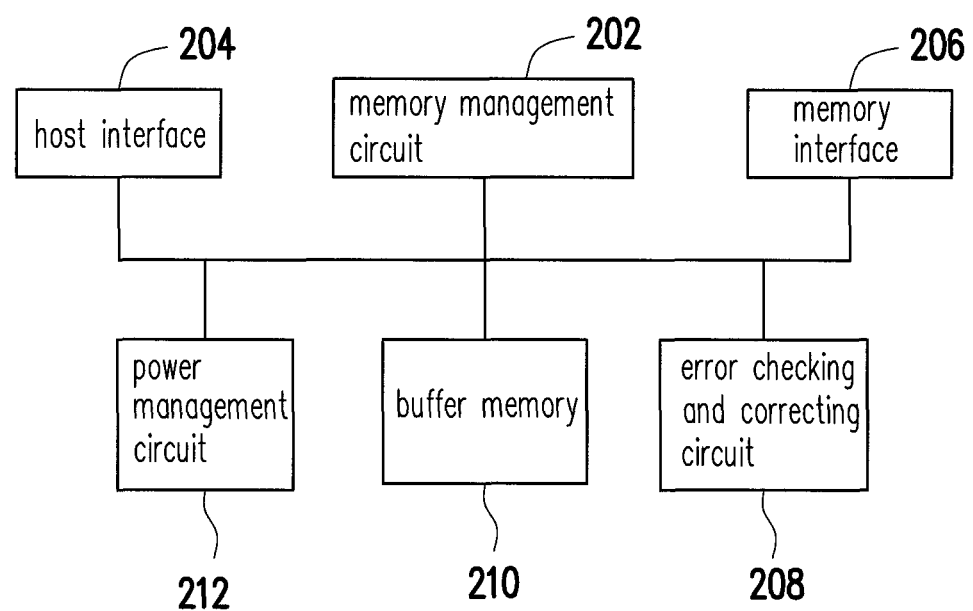
FIG. 11 is a schematic block diagram illustrating a memory controlling circuit unit according to an exemplary embodiment.

FIG. 11 is a schematic block diagram illustrating a memory controlling circuit unit according to an exemplary embodiment. It should be understood that, the structure of the memory controlling circuit unit depicted in FIG. 11 is only an example, and the invention is not limited thereto.

Referring to FIG. 11, the memory controlling circuit unit 104 includes a memory management circuit 202, a host interface 204, a memory interface 206 and an error checking and correcting circuit 208.

The memory management circuit 202 is configured to control overall operations of the memory controlling circuit unit 104. Specifically, the memory management circuit 202 has a plurality of control commands. When the memory storage device 100 operates, the control commands are executed to perform various operations such as data writing, data reading and data erasing. Operations of the memory management circuit 202 are similar to the operations of the memory controlling circuit unit 104, thus related description is omitted hereinafter.

In the present exemplary embodiment, the control commands of the memory management circuit 202 are implemented in a form of a firmware. For instance, the memory management circuit 202 has a microprocessor unit (not illustrated) and a ROM (not illustrated), and the control commands are burned into the ROM. When the memory storage device 100 operates, the control commands are executed by the microprocessor to perform operations of writing, reading or erasing data.

In another exemplary embodiment of the invention, the control commands of the memory management circuit 202 may also be stored as program codes in a specific area (for example, the system area in a memory exclusively used for storing system data) of the rewritable non-volatile memory module 106. In addition, the memory management circuit 202 has a microprocessor unit (not illustrated), a ROM (not illustrated) and a RAM (not illustrated). Particularly, the ROM has an activate code, which is executed by the microprocessor unit to load the control commands stored in the rewritable non-volatile memory module 106 to the RAM of the memory management circuit 202 when the memory controlling circuit unit 104 is enabled. Next, the control commands are executed by the microprocessor unit to perform operations of writing, reading or erasing data.

Further, in another exemplary embodiment of the invention, the control commands of the memory management circuit 202 may also be implemented in a form of hardware. For example, the memory management circuit 202 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured for managing the physical blocks of the rewritable non-volatile memory module 106; the memory writing circuit is configured for issuing a writing command to the rewritable non-volatile memory module 106 in order to write data into the rewritable non-volatile memory module; the memory reading circuit is configured for issuing a reading command to the rewritable non-volatile memory module 106 in order to read data from the rewritable non-volatile memory module 106; the memory erasing circuit is configured for issuing an erase command to the rewritable non-volatile memory module 106 in order to erase data from the rewritable non-volatile memory module 106; the data processing circuit is configured for processing both the data to be written into the rewritable non-volatile memory module 106 and the data to be read from the rewritable non-volatile memory module 106.

The host interface 204 is coupled to the memory management circuit 202 and configured to receive and identify commands and data sent from the host system 1000. Namely, the commands and data sent from the host system 1000 are passed to the memory management circuit 202 through the host interface 204. In the present exemplary embodiment, the host interface 204 is compatible to a SATA standard. However, it should be understood that the present invention is not limited thereto, and the host interface 204 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

The error checking and correcting circuit 208 is coupled to the memory management circuit 202 and configured to perform an error checking and correcting process to ensure the correctness of data. Specifically, when the memory management circuit 202 receives the writing command from the host system 1000, the error checking and correcting circuit 208 generates an error correcting code (ECC) or an error detecting code (EDC) for data corresponding to the writing command, and the memory management circuit 202 writes data and the ECC or the EDC corresponding to the writing command to the rewritable non-volatile memory module 106. Subsequently, when the memory management circuit 202 reads the data from the rewritable non-volatile memory module 106, the corresponding ECC or the EDC is also read from the rewritable non-volatile memory module 106, and the error checking and correcting circuit 208 executes the error checking and correcting procedure for the read data based on the ECC or the EDC. In the present exemplary embodiment, a low density parity code (LDPC) is used by the error checking and correcting circuit 208. However, in another exemplary embodiment, the error checking and correcting circuit 208 may also use a convolutional code, a turbo code, or other algorithms having a hard bit mode decoding procedure and a soft bit mode decoding procedure.

In the low density parity code, a valid codeword is defined by a parity check matrix. The parity check matrix is marked as a matrix H and a codeword is marked as CW hereinafter. According to an equation (1) below, in case a result calculated by multiplying the parity check matrix H by the codeword CW is a zero vector, it indicates that the codeword CW is the valid codeword. Therein, an operator $\otimes$ represents a mod 2 matrix multiplication. In other words, a null space of the matrix H includes all the valid codewords. However, a content of the codeword CW is not particularly limited in the invention. For instance, the codeword CW may also include an error correcting code or an error detecting code generated by using any algorithm.

$$H \otimes CW^T = 0 \tag{1}$$

Therein, a dimension of the matrix H is k-by-n, and a dimension of the codeword CW is 1-by-n. Therein, k and n are positive integers. The codeword CW includes message bits and parity bits. Namely, the codeword CW may be represented by [M P], in which a vector M is constituted by the message bits, and a vector P is constituted by the parity bits. A dimension of the vector M is 1-by-(n-k), and a dimension of the vector P is 1-by-k. Hereinafter, the message bits and the parity bits are collectively referred to as data bits. In other words, the codeword CW includes n bits, in which a length of the message bits is (n-k) bits, and a length of the parity bits is k bits. Namely, a code rate of the codeword CW is (n-k)/n.

Generally, a generation matrix (marked as G hereinafter) is used during decoding, so that an equation (2) below may be satisfied by arbitrary values of the vector M. Therein, a dimension of the generation matrix G is (n-k)-by-n.

$$M \otimes G = [MP] = CW \tag{2}$$

Therein, the codeword CW generated by the equation (2) is the valid codeword. Therefore, when the equation (2) is substituted into the equation (1), an equation (3) below may be obtained accordingly.

$$H \otimes G^T \otimes M^T = 0 \tag{3}$$

Since the vector M may be arbitrary values, an equation (4) below is definitely satisfied. In other words, after the parity check matrix H is decided, the corresponding generation matrix G may also be decided.

$$H \otimes G^T = 0 \tag{4}$$

When decoding the codeword CW, a parity check procedure is first performed on the data bits in the codeword. For instance, the parity check matrix H may be multiplied by the codeword CW to generate a vector (hereinafter, marked as S, as shown in an equation (5) below). If the vector S is the zero vector, the codeword CW may be directly outputted. If the vector S is not the zero vector, it indicates that the codeword CW is not the valid codeword.

$$H \otimes CW^T = S \tag{5}$$

A dimension of the vector S is k-by-1, in which each element is referred to as a syndrome. If the codeword CW is not the valid codeword, the error checking and correcting circuit 208 may perform a decoding procedure attempting to correct an error bit in the codeword CW.

Figure 12:
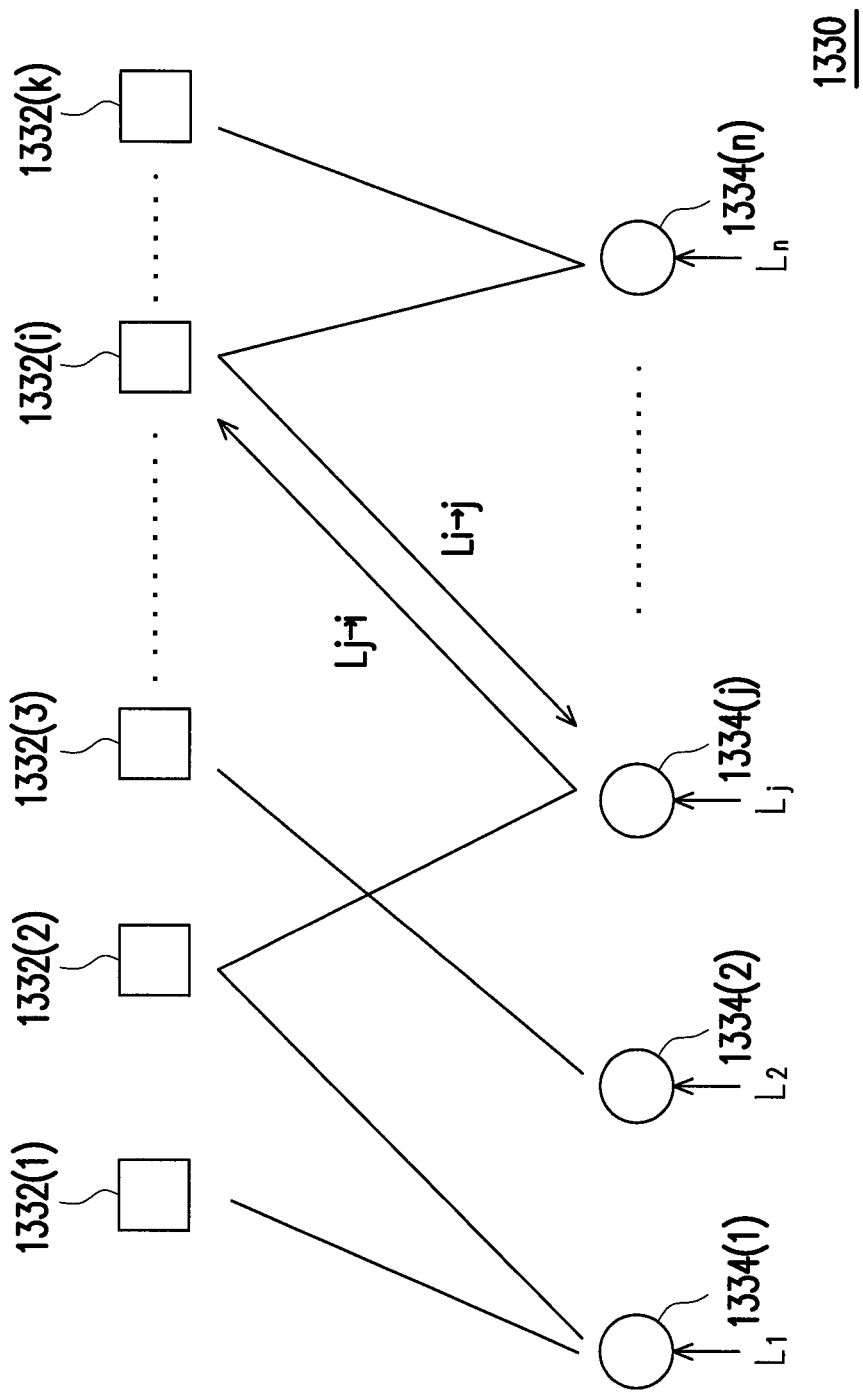
FIG. 12 is a schematic diagram illustrating a parity check matrix according to an exemplary embodiment.

FIG. 12 is a schematic diagram illustrating a parity check matrix according to an exemplary embodiment.

Referring to FIG. 12, generally, the parity check matrix H may be represented by a graph 1330 which includes parity nodes 1332(1) to 1332(k) and message nodes 1334(1) to 1334(n). Each of the parity nodes 1332(1) to 1332(k) is corresponding to one syndrome, and each of the message nodes 1334(1) to 1334(n) is corresponding to one data bit. Corresponding relations between the data bits and the syndromes (i.e., connecting relation between the message nodes 1334(1) to 1334(n) and the parity nodes 1332(1) to 1332(k)) is generated according to the parity check matrix. More specifically, in case an element at an $i^{th}$ row and a $j^{th}$ column is 1, a $i^{th}$ parity node 1332(i) is connected to a $j^{th}$ message node 1334(j), and i and j are positive integers.

When the memory management circuit 202 reads an n number of data bits (which forms one codeword) from the rewritable non-volatile memory module 106, the memory management circuit 202 may also obtain a channel reliability of each of the data bits. These channel reliabilities are used to represent probabilities (or referred to as a reliance level) of one specific data bit to be decoded into "1" or "0", detailed description thereof will be provided below. In the graph 1330, the message nodes 1334(1) to 1334(n) may also receive the corresponding channel reliabilities. For instance, the message node 1334(1) may receive a channel reliability $L_1$ of a first data bit, and the message node 1334(j) may receive a channel reliability $L_j$ of a $j^{th}$ data bit.

The error checking and correcting circuit 208 may perform the decoding procedure according to a structure of the graph and the channel reliabilities $L_1$ to $L_n$. The decoding procedure may include an iterative decoding. Specifically, in the iterative decoding, the message nodes 1334(1) to 1334(n) may calculate and provide the reliabilities to the parity nodes 1332(1) to 1332(m), and the parity nodes 1332(1) to 1332(m) may also calculate and provide the reliabilities to the message nodes 1334(1) to 1334(n). The reliabilities are transmitted along edges in the graph 1330. For instance, the reliability $L_{i \to j}$ is transmitted from the parity node 1332(i) to the message node 1334(j), and the reliability $L_{j \to i}$ is transmitted from the message node 1334(j) to the parity node 1332(i). These reliabilities are used to represent probabilities (or, the reliance level) of one specific data bit to be decoded into "1" or "0", which are considered by one node. For instance, the reliability $L_{j \to i}$ represents the reliance level (which may be positive or negative) for the $j^{th}$ data bit being decoded into "1" or "0" which is considered by the message node 1334(j), the reliability $L_{i \to j}$ represents the reliance level for the $j^{th}$ data bit being decoded into "1" or "0" which is considered by the message node 1332(i). The message nodes 1334(1) to 1334(n) and the parity nodes 1332(1) to 1332(m) may calculate reliabilities to be outputted according to the reliability being inputted, which is similar to that in calculating the conditional probabilities of one specific data bit to be decoded into "1" or "0". Therefore, above-mentioned process of transmitting the reliabilities may also be referred to as a belief propagation.

Based on different algorithms being adopted, different reliabilities may be calculated by the message nodes 1334(1) or 1334(n) and/or the parity nodes 1332(1) to 1332(m). For instance, the error checking and correcting circuit 208 may adopt a Sum-Product Algorithm, a Min-Sum Algorithm, or a bit-flipping Algorithm, but the algorithm being adopted is not particularly limited in the invention.

In each iteration of the iterative decoding, the message nodes 1334(1) to 1334(n) may transmit the reliabilities to the parity nodes 1332(1) to 1332(m), and the parity nodes 1332 (1) to 1332(m) may transmit the reliabilities to the message nodes 1334(1) to 1334(n). After each of the iteration, the message nodes 1334(1) to 1334(n) may calculate the probabilities of each data bit to be decoded into "1" or "0" according to the current reliability. Subsequently, the parity check procedure is performed on the calculated data bit. Namely, the codeword generated by the data bit is multiplied by the parity check matrix, so as to determine whether such codeword is the valid codeword. If the generated codeword is the valid codeword, the iterative decoding is stopped. If the generated codeword is not the valid codeword, the next iteration is performed. When a number of iterations in the iterative decoding exceeds a preset value, the iterative decoding is also stopped, indicating that decoding fails.

Figure 13:
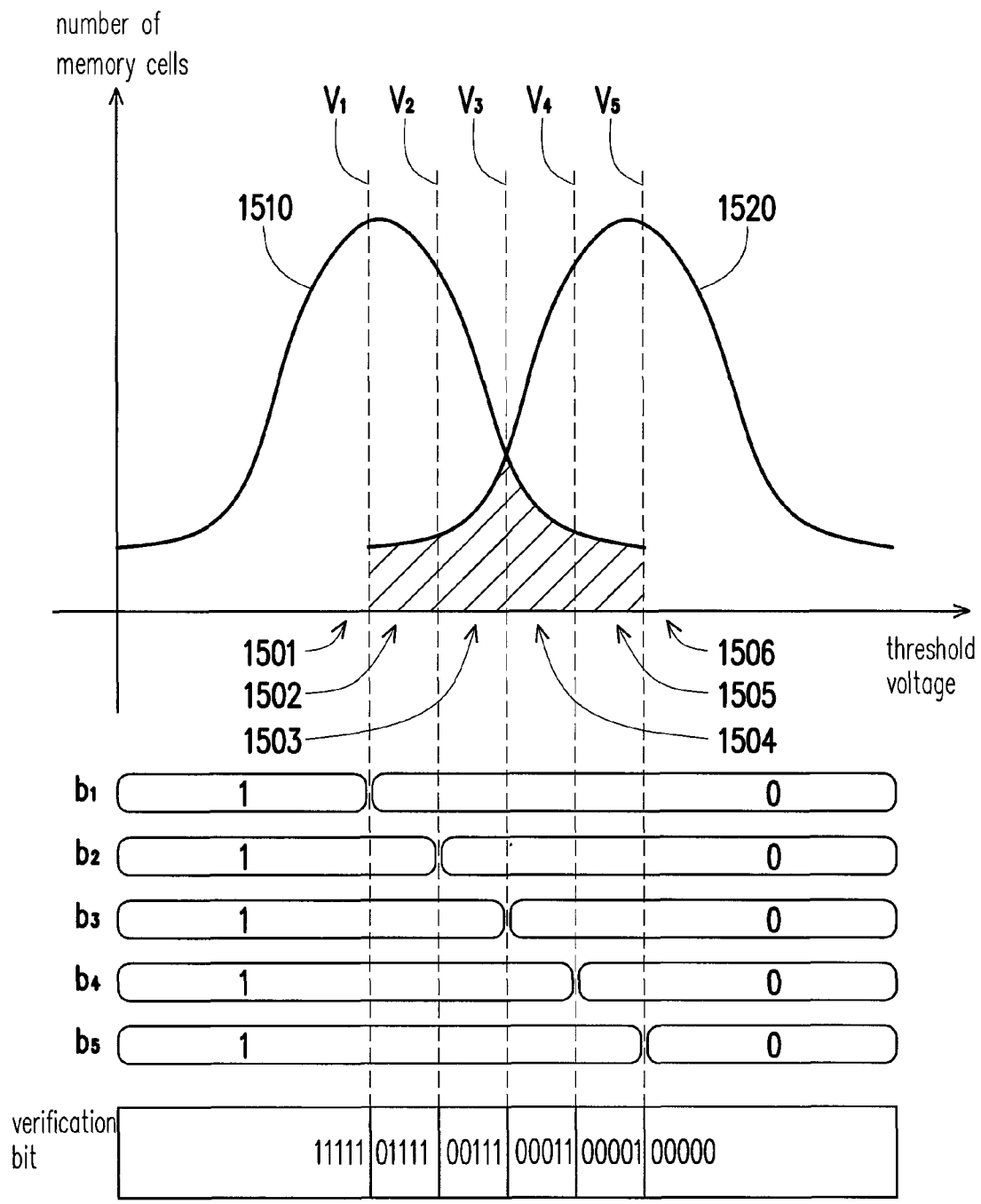
FIG. 13 illustrates a schematic diagram for reading a verification bit according to an exemplary embodiment.

FIG. 13 illustrates a schematic diagram for reading a verification bit according to an exemplary embodiment. Referring to FIG. 13, it is assumed that the memory cell in a storage status 1510 stores the bit "1", and the memory cell in a storage status 1520 stores the bit "0". The storage status 1510 may be partially overlapped with the storage status 1520, namely, under some specific read voltages, a part of memory cells in the storage status 1510 may be determined as belonging to the storage status 1520, and a part of memory cells in the storage status 1520 may be determined as belonging to the storage status 1510. When a read voltage is applied to the control gate of the memory cell, the verification bit obtained by the memory management circuit 202 may be "0" or "1" depended on whether the channel of the memory cell is turned on. Hereinafter, it is assumed that the corresponding verification bit is "0" when the channel of the memory cell is not turned on, otherwise, it is "1". In an exemplary embodiment, when the memory management circuit 202 applies read voltages $V_1$ to $V_5$ to one specific memory cell, 5 verification bits may be obtained by the memory management circuit 202. For instance, the read voltage $V_1$ is corresponding to the verification bit $b_1$; the read voltage $V_2$ is corresponding to the verification bit $b_2$; the read voltage $V_3$ is corresponding to the verification bit $b_3$; the read voltage $V_4$ is corresponding to the verification bit $b_4$; and the read voltage $V_5$ is corresponding to the verification bit $b_5$. The memory management circuit 202 may obtain the verification bit from the verification bit $b_1$ to the verification bit $b_5$ in following manner when the threshold voltage of one memory cell falls within an interval 1501, the verification bit is "11111"; when the threshold voltage of one memory cell falls within an interval 1502, the verification bit is "01111"; when the threshold voltage of one memory cell falls within an interval 1503, the verification bit is "00111"; when the threshold voltage of one memory cell falls within an interval 1504, the verification bit is "00011"; when the threshold voltage of one memory cell falls within an interval 1505, the verification bit is "00001"; and when the threshold voltage of one memory cell falls within an interval 1506, the verification bit is "00000". In another exemplary embodiment, the rewritable non-volatile memory module 106 may also transmit, after calculating the verification bits $b_1$ to $b_5$, the calculated verification bits to the memory management circuit 202. For instance, an exclusive OR calculation may be performed on the verification bits $b_2$ and $b_4$, an exclusive OR calculation may be performed on the verification bits $b_1$ and $b_5$. Accordingly, only 3 verification bits are obtained by the memory management circuit 202. However, a number and a content of the verification bits are not particularly limited in the invention.

In the present exemplary embodiment, one of the read voltages $V_1$ to $V_5$ is set to a sign read voltage. The sign read voltage is used to decide the data bit. For instance, in case the read voltage $V_3$ is a sign read voltage, the data bit is identical to the verification bit $b_3$; and in case the read voltage $V_2$ is the sign read voltage, the data is identical to the verification bit $b_2$, and the rest may be deduced by analogy. In each interval, based on the probability of the memory cell belonging to the storage status 1510 and the probability of the memory cell belonging to the storage status 1520, a log likelihood ratio (LLR) may be calculated, and the log likelihood ratio may also be referred to as the channel reliability of the data bits in the present exemplary embodiment. In an exemplary embodiment, the log likelihood ratio corresponding to each of the intervals may be calculated and stored in a lookup table in advance. The memory management circuit 202 may input the verification bits $b_1$ to $b_5$ to the lookup table, so as to obtain the corresponding log likelihood ratio to serve as the channel reliability. The obtained channel reliability may be used to perform said iterative decoding (i.e., $L_1$ to $L_n$ in FIG. 12). In an exemplary embodiment, when different sign read voltages are set, the channel reliability may be obtained by using different lookup tables.

It should be noted that, if a number of read voltages is x, the channel reliability may include a x+1 number of possible values, in which x is a positive integer. If the number of read voltages is 1 (e.g., only the read voltage $V_3$ is used), the decoding procedure being performed is also referred to as a hard bit mode decoding procedure. If the number of read voltage is greater than 1, the decoding procedure being performed is also referred to as a soft bit mode decoding procedure. Further, in an exemplary embodiment, when the hard bit mode decoding procedure is performed, the memory management circuit 202 may calculate the channel reliability directly through the obtained verification bit without using the lookup table. For instance, in case the verification bit is "1", the channel reliability may be set to y; and if the verification bit is "0", the channel reliability may be set to −y, in which y is a real number.

Generally, information used by the soft bit mode decoding procedure is relatively more, such that more of error bits may be corrected, but an executing speed thereof is slower. In the present exemplary embodiment, if the valid codeword is not generated by the hard bit mode decoding procedure, the memory management circuit 202 may increase the number of read voltages, so as to increase a speed of decoding.

More specifically, it is assumed that the memory management circuit 202 intends to read a plurality of memory cells, and the memory cells are stored with data. These memory cells may belong to the same physical programming unit or different physical programming units, and the invention is not limited thereto. Further, a number of the memory cells and a content of the data are not limited in the invention either. The memory management circuit 202 may read at least one of the memory cells according to a first read voltage to obtain at least one first verification bit. The error checking and correcting circuit 208 may execute a hard bit mode decoding procedure according to the first verification bits, and determine whether a valid codeword (also known as a first valid codeword) is generated by the hard bit mode decoding procedure. For instance, the error checking and correcting circuit 208 may take the verification bits as the data bits (which forms one codeword) for obtaining the channel reliability, executing the iteration decoding and executing the parity check procedure. Nevertheless, the hard bit mode decoding procedure have been described in detail above, thus related description thereof is omitted hereinafter. If the valid codeword is not generated by the hard bit mode decoding procedure, the memory management circuit 202 may obtain storage information of said memory cells decoded by the hard bit mode decoding procedure, and decide a voltage number according to the storage information. However, the invention is not intended to limit the storage information only to be obtained from said memory cells decoded by the hard bit mode decoding procedure. In another embodiment, the storage information may also be obtained from adjacent memories which are different from said memory cells decoded by the hard bit mode decoding procedure, and said adjacent memories may be stored with the data bits which are different from said data, or even be memory cells not storing any data bits. In order to facilitate the illustration, the present embodiment is illustrated by using said memory cells decoded by the hard bit mode decoding procedure (hereinafter, referring to as "said memory cells") as an example. After the storage information is obtained, the memory management circuit 202 may estimate an amount of error bits in the data according to the storage information. Therein, the voltage number positively correlates the amount of the error bits in the data. Namely, when the amount of the error bits in the data gets greater, the voltage number also becomes greater. Next, the memory management circuit 202 reads said memory cells according to a plurality of second read voltages matching the voltage number to obtain a plurality of second verification bits. For instance, in case the voltage number is a positive number p, the memory management circuit 202 may read said memory cells according to a p number of the second read voltages. The error checking and correcting circuit 208 may execute a first soft bit mode decoding procedure according to the second verification bits. Nevertheless, the soft bit mode decoding procedure have been described in detail above, thus related description thereof is omitted hereinafter. Accordingly, in case the valid codeword is not generated by the hard bit mode decoding procedure, if the amount of the error bits estimated is not as many, it may only require the p number of read voltages for decoding successfully without using more of the read voltages (more than p number), such that the speed of decoding may be increased.

In an exemplary embodiment, the storage information may include a number of erased times of said memory cells, an elapsed time after storing the data in said memory cells, a number of read times, or any combination of the above. More specifically, when the number of erased times of said memory cells is greater, the amount of the error bits in the data may be greater, such that the voltage number being calculated may also be greater. Similarly, if the elapsed time after storing the data in said memory cells is longer, the amount of the error bits in the data may also be greater. Or, if the data after being stored in said memory cells has been read for many times, the amount of the error bits in the data may also be greater. The memory management circuit 202 may calculate the elapsed time after storing the data in said memory cells by using a counter. The counter may be implemented in software or hardware, but the invention is not limited thereto.

Table 1 as provided below is an example of calculating the amount of the error bits. In order to facilitate the illustration, the storage information in Table 1 only includes the number of erased times and the elapsed time after storing the data in said memory cells, but the invention is not limited thereto.

TABLE 1

|  | One year | Three years |
| --- | --- | --- |
| erased for 100 times | 10 bits | 30 bits |
| erased for 300 times | 30 bits | 60 bits |
| erased for 500 times | 70 bits | 120 bits |
| erased for 700 times | 100 bits | 200 bits |

For instance, in case the number of erased times of said memory cells is 100 times and the data has been stored in said memory cells for one year, the amount of the error bits estimated is 10; and in case the number of erased times of said memory cells is 700 times and the data has been stored in said memory cells for three years, the amount of the error bits estimated is 200. However, based on different manufacturing processes of the rewritable non-volatile memory module 106, the amount of the error bits in Table 1 may be different. In an exemplary embodiment, if the amount of the error bits is greater than a first threshold (e.g., 30), the memory management circuit 202 may set the voltage numbers to 3. If the amount of the error bits is greater than a second threshold (e.g., 70), the memory management circuit 202 may set the voltage numbers to 5. However, values of the first threshold and the second threshold are not particularly limited in the invention. In addition, a method of calculating the voltage number according to the amount of the error bits is not limited in the invention either.

After the first soft bit mode decoding procedure is executed, the error checking and correcting circuit 208 may determine whether a valid codeword (also known as a second valid codeword) is generated by the first soft bit mode decoding procedure. If the valid codeword is not generated by the first soft bit mode decoding procedure, the memory management circuit 202 may increase the voltage number (e.g., added by two, but the invention is not limited thereto). Next, the memory management circuit 202 may read said memory cells according to a plurality of third read voltages matching the increased voltage number to obtain a plurality of third verification bits. For instance, the memory management circuit 202 may read said memory cells according to a (p+2) number of the third read voltages. The error checking and correcting circuit 208 may execute a second soft bit mode decoding procedure according to the third verification bits. Because the number of the second read voltages is less than the number of the third read voltages, the second soft bit mode decoding procedure has a higher probability in correcting more of the error bits as in comparison to the first soft bit mode decoding procedure. However, the second soft bit mode decoding procedure and the first soft bit mode decoding procedure may use the same or different algorithms, and the invention is not limited thereto. In an exemplary embodiment, if the valid codeword is not generated by the second soft bit mode decoding procedure, the memory management circuit 202 may further increase the voltage number, and an upper limit of the voltage number is not particularly limited in the invention. In case the voltage number has reached the upper limit and the valid codeword is still not generated by the corresponding soft bit mode decoding procedure, it indicates that decoding fails.

Figure 14:
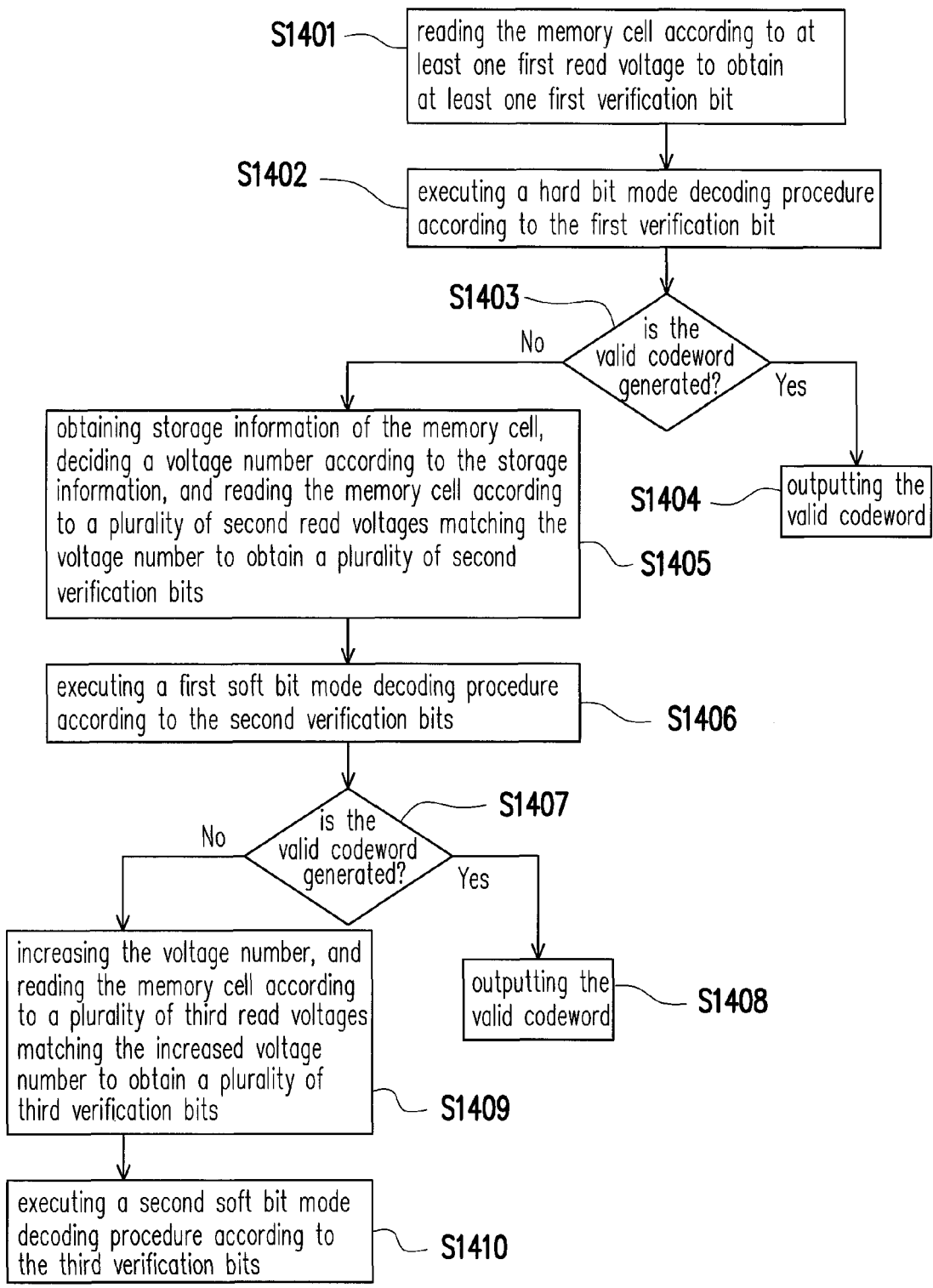
FIG. 14 is a flowchart illustrating a decoding method according to an exemplary embodiment.

FIG. 14 is a flowchart illustrating a decoding method according to an exemplary embodiment.

Referring to FIG. 14, in step S1401, memory cells are read according to at least one first read voltage to obtain at least one first verification bit. In step S1402, a hard bit mode decoding procedure is executed according to the first verification bit. In step S1403, whether the valid codeword is generated is determined. If the valid codeword is generated, in step S1404, the valid codeword is outputted. If the valid codeword is not generated, in step S1405, storage information of said memory cells is obtained, a voltage number is decided, and said memory cells are read according to second read voltages matching the voltage number to obtain a plurality of second verification bits. In step S1406, a first soft bit mode decoding procedure is executed according to the second verification bits. In step S1407, whether the valid codeword is generated is determined. If the valid codeword is generated in step S1407, the valid codeword is outputted in step S1408. If the valid codeword is not generated in step S1407, in step S1409, the voltage number is increased, and said memory cells are read according to third read voltages matching the increased voltage number to obtain a plurality of third verification bits. In step S1410, a second soft bit mode decoding procedure is executed according to the third verification bits. Nevertheless, steps depicted in FIG. 14 are described in detail as above, thus related description is omitted hereinafter. It should be noted that, the steps depicted in FIG. 14 may be implemented as a plurality of program codes or circuits, and the invention is not limited thereto.

Based on above, in the decoding method, the memory storage device, the memory controlling circuit unit proposed according to the exemplary embodiments of the invention, the voltage number may be decided according to the storage information, and the voltage number may be gradually increased. Accordingly, excessive number of read voltages will not be used if the valid codeword is not generated by the hard bit mode decoding procedure, such that the speed of decoding may be increased.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method for a rewritable non-volatile memory module, wherein the rewritable non-volatile memory module comprises a plurality of memory cells, and the decoding method comprises:
   reading at least one of the memory cells according to a first read voltage to obtain at least one first verification bit;
   executing a hard bit mode decoding procedure according to the at least one first verification bit, and determining whether a first valid codeword is generated by the hard bit mode decoding procedure;
   if the first valid codeword is not generated by the hard bit mode decoding procedure, obtaining storage information of the at least one of the memory cells;
   deciding a voltage number according to the storage information;
   reading the at least one of the memory cells according to a plurality of second read voltages matching the voltage number to obtain a plurality of second verification bits; and
   executing a first soft bit mode decoding procedure according to the second verification bits.

2. The decoding method of claim 1, further comprising:
   determining whether a second valid codeword is generated by the first soft bit mode decoding procedure;
   if the second valid codeword is not generated by the first soft bit mode decoding procedure, increasing the voltage number;
   reading the at least one of the memory cells according to a plurality of third read voltages matching the increased voltage number to obtain a plurality of third verification bits; and
   executing a second soft bit mode decoding procedure according to the third verification bits.

3. The decoding method of claim 1, wherein data is stored in the at least one of the memory cells, and the step of deciding the voltage number according to the storage information comprises:
   estimating an amount of error bits in the data according to the storage information, wherein the voltage number positively correlates the amount of the error bits in the data.

4. The decoding method of claim 1, wherein the storage information comprises a number of erased times of the at least one of the memory cells.

5. The decoding method of claim 1, wherein data is stored in the at least one of the memory cells, and the storage information comprises an elapsed time after storing the data in the at least one of the memory cells.

6. The decoding method of claim 1, wherein data is stored in the at least one of the memory cells, and the storage information comprises a number of read times of the data stored in the at least one of the memory cells.

7. A memory storage device, comprising:
   a connection interface unit configured to couple to a host system;
   a rewritable non-volatile memory module comprising a plurality of memory cells; and
   a memory controlling circuit unit coupled to the connection interface unit and the rewritable non-volatile memory module, and configured to read at least one of the memory cells according to a first read voltage to obtain at least one first verification bit, execute a hard bit mode decoding procedure according to the at least one first verification bit, and determine whether a first valid codeword is generated by the hard bit mode decoding procedure,
   wherein if the first valid codeword is not generated by the hard bit mode decoding procedure, the memory controlling circuit unit is configured to obtain storage information of the at least one of the memory cells, decide a voltage number according to the storage information, read the at least one of the memory cells according to a plurality of second read voltages matching the voltage number to obtain a plurality of second verification bits, and execute a first soft bit mode decoding procedure according to the second verification bits.

8. The memory storage device of claim 7, wherein the memory controlling circuit unit is further configured to determine whether a second valid codeword is generated by the first soft bit mode decoding procedure,
   if the second valid codeword is not generated by the first soft bit mode decoding procedure, the memory controlling circuit unit is configured to increase the voltage number, read the at least one of the memory cells according to a plurality of third read voltages matching the increased voltage number to obtain a plurality of third verification bits, and execute a second soft bit mode decoding procedure according to the third verification bits.

9. The memory storage device of claim 7, wherein data is stored in the at least one of the memory cells, and the operation of memory controlling circuit unit deciding the voltage number according to the storage information comprises:
the memory controlling circuit unit estimates an amount of error bits in the data according to the storage information, wherein the voltage number positively correlates the amount of the error bits in the data.

10. The memory storage device of claim 7, wherein the storage information comprises a number of erased times of the at least one of the memory cells.

11. The memory storage device of claim 7, wherein data is stored in the at least one of the memory cells, and the storage information comprises an elapsed time after storing the data in the at least one of the memory cells.

12. The memory storage device of claim 7, wherein data is stored in the at least one of the memory cells, and the storage information comprises a number of read times of the data stored in the at least one of the memory cells.

13. A memory controlling circuit unit, for controlling a rewritable non-volatile memory module, wherein the rewritable non-volatile memory module comprises a plurality of memory cells, and the memory controlling circuit unit comprises:
a host interface configured to couple to a host system;
a memory interface configured to couple to the rewritable non-volatile memory module;
a memory management circuit coupled to the host interface and the memory interface, and configured to read at least one of the memory cells according to a first read voltage to obtain at least one first verification bit; and
an error checking and correcting circuit, configured to execute a hard bit mode decoding procedure according to the at least one first verification bit, and determine whether a first valid codeword is generated by the hard bit mode decoding procedure,
wherein if the first valid codeword is not generated by the hard bit mode decoding procedure, the memory management circuit is configured to obtain storage information of the at least one of the memory cells, decide a voltage number according to the storage information, read the at least one of the memory cells according to a plurality of second read voltages matching the voltage number to obtain a plurality of second verification bits,
wherein the error checking and correcting circuit is configured to execute a first soft bit mode decoding procedure according to the second verification bits.

14. The memory controlling circuit unit of claim 13, wherein the error checking and correcting circuit is further configured to determine whether a second valid codeword is generated by the first soft bit mode decoding procedure,
if the second valid codeword is not generated by the first soft bit mode decoding procedure, the memory management circuit is configured to increase the voltage number, and read the at least one of the memory cells according to a plurality of third read voltages matching the increased voltage number to obtain a plurality of third verification bits,
wherein the error checking and correcting circuit is further configured to execute a second soft bit mode decoding procedure according to the third verification bits.

15. The memory controlling circuit unit of claim 13, wherein data is stored in the at least one of the memory cells, and the operation of memory management circuit deciding the voltage number according to the storage information comprises:
the memory management circuit estimates an amount of error bits in the data according to the storage information, wherein the voltage number positively correlates the amount of the error bits in the data.

16. The memory controlling circuit unit of claim 13, wherein the storage information comprises a number of erased times of the at least one of the memory cells.

17. The memory controlling circuit unit of claim 13, wherein data is stored in the at least one of the memory cells, and the storage information comprises an elapsed time after storing the data in the at least one of the memory cells.

18. The memory controlling circuit unit of claim 13, wherein data is stored in the at least one of the memory cells, and the storage information comprises a number of read times of the data stored in the at least one of the memory cells.

* * * * *